United States Patent

Cornett et al.

[11] Patent Number: 5,561,194
[45] Date of Patent: Oct. 1, 1996

[54] PHOTORESIST COMPOSITION INCLUDING POLYALKYLMETHACRYLATE CO-POLYMER OF POLYHYDROXYSTYRENE

[75] Inventors: Kathleen M. Cornett; Judy B. Dorn; Margaret C. Lawson, all of Dutchess County; Leo L. Linehan, Orange County; Wayne M. Moreau, Dutchess County; Randolph J. Smith, Orange County; Gary T. Spinillo, Dutchess County, all of N.Y.

[73] Assignee: International Business Machines Corporation, Armonk, N.Y.

[21] Appl. No.: 412,806

[22] Filed: Mar. 29, 1995

[51] Int. Cl.$^6$ .................... C08L 61/10; C08L 33/12; C08L 25/04
[52] U.S. Cl. .................. 525/143; 525/148; 525/227; 525/241; 525/502; 525/508
[58] Field of Search ................... 525/143, 148, 525/241, 227, 502, 508

[56] References Cited

U.S. PATENT DOCUMENTS

| | | |
|---|---|---|
| 4,097,283 | 6/1978 | Asano et al. ............. 96/115 R |
| 4,237,216 | 12/1980 | Skarvinko ............... 430/280 |
| 4,684,599 | 8/1987 | DoMinh et al. .......... 430/270 |
| 4,696,886 | 9/1987 | Hanabata et al. ........ 430/192 |
| 4,920,028 | 4/1990 | Lazarus et al. .......... 430/192 |
| 4,980,264 | 12/1990 | Chiong et al. ........... 430/192 |
| 5,153,102 | 10/1992 | Lee et al. ................ 430/284 |
| 5,256,521 | 10/1993 | Jayaraman .............. 430/296 |
| 5,275,911 | 1/1994 | Toukhy ................... 430/191 |
| 5,275,921 | 1/1994 | Koizumi et al. ......... 430/326 |
| 5,374,693 | 12/1994 | Lynch et al. ............ 525/501 |

Primary Examiner—W. Robinson H. Clark
Attorney, Agent, or Firm—Whitman, Curtis, Whitman & McGinn; Steven J. Soucar

[57] ABSTRACT

A polyalkylmethacrylate co-polymer of polyhydroxystyrene has been found to be an ideal blending partner in a novolak photoresist composition. The preferred co-polymer is poly(p-hydroxystyrene)-co-(methyl methacrylate). The co-polymer is fully miscible with novolaks and has a high thermal stability (>150° C.).

19 Claims, No Drawings

PHOTORESIST COMPOSITION INCLUDING POLYALKYLMETHACRYLATE CO-POLYMER OF POLYHYDROXYSTYRENE

BACKGROUND OF THE INVENTION

1. Field of the Invention

The invention is generally related to photoresist compositions used in the fabrication of microelectronic circuitry and, more particularly, to a novolak photoresist composition including a photosensitizer and a polyalkylmethacrylate co-polymer of polyhydroxystyrene.

2. Description of the Prior Art

Novolaks are thermoplastic phenol-formaldehyde type resins that are obtained primarily by the use of acid catalysts and excess phenol. These types of resins are generally alcohol and alkali soluble, and can be reacted to form insoluble, crosslinked materials. Novolaks have been used extensively in the microelectronics industry as photoresist materials that are used for patterning substrates such as semiconductor wafers and chips, as well as printed circuit boards and other substruates. For example, U.S. Pat. No. 4,237,216 to Skarvinko discloses a photosensitive patternable coating composition containing novolak materials, U.S. Pat. No. 4,920,028 to Lazarus et al. discloses a high contrast positive photoresist which includes a novolak prepared with mixed cresol and hydroxybenzaldehyde together with a diazoquinone sensitizer, and U.S. Pat. No. 4,980,264 to Chiong et al. shows a photoresist composition that has a controlled dissolution rate in alkaline developers, and each of these patents are herein incorporated by reference.

Because the synthesis of novolak involves condensation reactions which produces linear and branched structures of wide polydispersity and inconsistent physical properties, it is common practice to blend various molecular weight grades to obtain more consistent performance (see, T. R. Pamapolone, *Solid State Technology*, 6/1984, pgs 115–120). This procedure adds extra cost and time to adjust photospeed by the addition of novolak resin blend partners and photoactive components.

In patterning operations, a photoresist composition is deposited on a substrate, typically as a layer on the order of several microns thick, and portions of the layer are selectively exposed to energy (UV, I-line, infrared, X-rays, etc.). The exposure step is most often performed using a mask with the photoresist being exposed at only the portions not covered by the mask. The exposure step causes a chemical change in the exposed regions relative to the non-exposed regions. For "positive" photoresists, the exposed region becomes soluble, while the unexposed regions remain insoluble. The exposed regions are then removed and the hardened and patterned photoresist remains in place on the substrate for further processing operations (i.e., reactive ion etching (RIE), chemical vapor deposition (CVD), etc.). For "negative" photoresists, the exposed region becomes insoluble and may be subject to subsequent processing (e.g., heat treatment, etc.). Thus, the unexposed regions remain soluble in a negative photoresist and the exposed regions of the photoresist remain for subsequent processing steps to be performed.

In traditional photoresists which employ novolaks, such as cresol resins and related monomers such as resorcinol, ethyl phenol, xylenols, etc., and photoactive compounds such as diazonaphthoquinones (DNQs), the resist photospeed and performance have usually been optimized by blending a low molecular weight resin ("fast" resin) and a high molecular weight resin ("slow" resin). For example, U.S. Pat. No. 5,374,693 to Lynch et al., which is herein incorporated by reference, discloses using a mixture of novolak resins which have similar dissolution rates, but which have dissimilar molecular weights, as a photoresist material for patterning semiconductor substrates. Lynch et al. particularly recommends using novolaks with molecular weights that differ by more than 10–60%.

While blending of novolaks is widely used in the electronics industry, there are several disadvantanges. The most significant disadvantage is that because novolaks are highly branched polymers, there is a wide variation in lot-to-lot performance of the novolak resin mixtures, especially when using low molecular weight or "fast" novolaks.

One approach for enhancing the performance of novolaks in DNQ resists which has been attempted is to use poly(p-hydroxystyrene) as a blending partner. When poly-p-hydroxystyrene (PHS) has been used as a blending partner with novolak and diazoquinone inhibitor (see, Hattori et al., *Jap. J. Appl. Phys.*, 30, 3125 (1991)), it was found that blended partners with high or low molecular weight PHS exhibit a weak dissolution inhibition effect.

The observations of Hattori et al. have been confirmed by the inventors of the present patent application. Specifically, they have observed loss of the unexposed resist with PHS-novolak DQ blends, and surface pitting occurred, presumably due to the loss of PHS from the matrix.

Other constituents have been added to novolak photoresists to achieve particular results. For example, U.S. Pat. No. 5,275,921 to Koizumi discloses included Sudan Orange dye in the photoresist material to decrease light reflection from the substrate, U.S. Pat. No. 5,256,521 to Jayarama discloses adding a tris(hydroxyphenyl) lower alkane to a photoresist composition as a sensitivity enhancer, and U.S. Pat. No. 5,275,911 to Toukhy discloses the addition of sesamol/aldehyde condensation products in the photoresist material as sensitivity enhancers, and each of these patents are herein incorporated by reference.

SUMMARY OF THE INVENTION

It is an object of this invention to provide an improved novolak photoresist composition which includes a polyalkylmethacrylate copolymer of polyhydroxystyrene.

It is another object of this invention to provide consistent, "fast", polymeric components useful for modifying or adjusting the photospeed of novolak formulations.

According to the invention, it has been discovered that a particularly advantageous blending partner for novolak photoresists is a low molecular weight polyalkylmethacrylate co-polymer of polyhydroxystyrene. Preferably, the co-polymer is poly(p-hydroxystyrene)-co-(methylmethacrylate) having a molecular weight ranging from 2,000–50,000 mw. The low molecular weight of the blending partner increases the photospeed of the novolak resist. In addition, unlike the homopolymer of poly(p-hydroxystyrene), the polyalkylmethacrylate co-polymer of poly(p-hydroxystyrene) is fully miscible with novolaks during the development stage in spite of its extremely high dissolution rate. This unexpected property makes polyalkylmethacrylate co-polymers of polydroxystyrene, such as poly(p-hydroxystrene)-co-(methylmethacrylate), an ideal polymer for use as a "fast" partner for a slow novolak in a photoresist, such as DNQ photoresists. In addition, the thermal stability of polyalkylmethacrylate co-polymers of polyhydroxystyrene, such as poly(p- hydroxystrene)-co-(methylmethacrylate), are in excess of 150° C., and this property improves the thermal stability of the entire photoresist composition.

DETAILED DESCRIPTION OF THE PREFERRED EMBODIMENTS OF THE INVENTION

The invention is particularly related to the use of polyalkylmethacrylate co-polymers of polyhydroxystyrene, such as poly(p-hydroxystyrene)-co-(methyl methacrylate), as blending partners for novolak in novolak photoresist compositions, particularly those which include DNQ photoactive compounds. The polyalkylmethacrylate co-polymers of polyhydroxystyrene of the present invention have the following chemical structure:

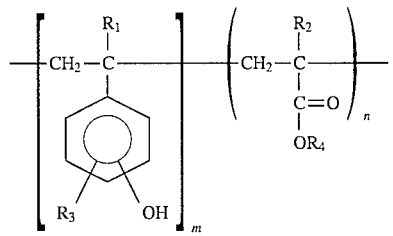

where $R_2$ is a methyl group, and $R_1$ and $R_3$ are each hydrogen or alkyl (preferably, $C_{1-12}$ alkyl moities) and may be the same or different, and where $R_4$ is alkyl (preferably, $C_{1-12}$ alkyl moities) or aryl (preferably phenyl or naphthyl, but also includes heterocyclic aryl moities), and where m and n are each greater than one and may be the same or different. The polyalkylmethacrylate co-polymers of polyhydroxystyrene would only differ in terms of thermal stability. The polyalkylmethacrylate co-polymers of polyhydroxystyrene would serve the function as a "fast" blending partner for novolaks in novolak photoresist materials, and preferably would have a molecular weight which ranges from 2,000 to 50,000 mw. The polyalkylmethacrylate co-polymers of polyhydroxystyrene constitute oil-30% w/w of the photoresist composition (dry weight not including solvent).

The invention is practicable with a wide variety of novolak resins and resin blends. For example, novolaks can be prepared by forming an admixture of formaldehyde and one or more phenolic compounds, such as meta-cresol (m-cresol), para-cresol (p-cresol), 3,5 xylenol, 3,4-xylenol, etc., and a suitable catalyst, such as oxalic acid, maleic anhydride, or the like, and heating the mixture for a time period and at a temperature sufficient to form the novolak resin (e.g., 60°– 150° C. for 1–12 hrs.). Particularly good novolak resins have been formed from phenolic blends with approximately 60–90% w/w m-cresol and 10–40% w/w 3,5-dimethyl phenol, and from blends with approximately 20–80% w/w m-cresol, 15–75% w/w p-cresol, and 0–5% ethyl phenol (o- or p-ethyl phenol). The average molecular weight of the novolak resins used in the practice of this invention is preferably in the range of 5,000 to 20,000. The novolak resin is the major component of the photoresist film, and can generally constitute between 60–95% w/w of the photoresist composition (dry weight not including the solvent).

The invention is practicable with a wide variety of photoactive compounds which are sometimes referred to as sensitizers or photosensitizers. The photoactive compound is responsible for initiating the reaction that results in differential solubility of the photoresist material. In the case of positive resists, the imaged area is dissolved after being exposed to a light source (e.g., UV, electron beam, I-line, X-rays, etc.). Conversely, in the case of a negative resist, the imaged area remains behind after other processing steps (e.g., heating, etc.). Preferably, the photoactive compound is present in the photoresist composition at 1–25% w/w (dry weight not including solvent).

The most preferred photoactive compounds are diazonapthoquinones (DNQs). Particularly good results can be achieved using diazoquinone-sulfonyl esters of tris-hydroxyphenyl alkanes and isopropylidenediphenol (Bis-Phenol-A), as the photoactive compounds. The photoactive compound should comprise approximately 5–40% w/w and more preferably 10–25% w/w of the photoresist composition (dry weight not including solvent). U.S. Pat. Nos. 4,684,599 to DoMinh et al. and 4,920,028 to Lazarus and 4,097,283 to Asono et al., each of which are herein incorporated by reference, show that quinone type sensitizers are useful in photoresist compositions employing novolak resins. However, it should be understood that a wide variety of photoactive compounds can be used in the practice of this invention, including resorcinol 1,2-naphthoquinonediazide-4-sulfonic acid esters; pyrogallol 1,2-naphthoquinonediazide-5-sulfonic acid esters; 1,2-quinonediazidesulfonic acid esters of polyhydroxyphenyl alkyl ketones or polyhydroxyphenyl aryl ketones such as 2,4-dihydroxyphenyl propyl ketone 1,2-benzoquinone-diazide-4-sulfonic acid esters, 2,4-dihydroxyphenyl hexyl ketone 1,2-naphthoquinone-diazide-4-sulfonic acid esters, 2,4-dihydroxybenzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinonediazide-5-sulfonic acid esters, 2,2',4,4'-tetrahydroxybenzophenone 1,2-naphthoquinonediazide-5-sulfonic acid esters, 2,2', 4,4'-tetrahydroxybenzophenone 1,2-naphthoquinonediazide-4-sulfonic acid esters, 2,3,4,4'-tetrahydroxybenzophenone 1,2-naphthoquinonediazide-4-sulfonic acid esters, 2,2',3,4',6'-pentahydroxybenzophenone 1,2-naphthoquinonediazide-5-sulfonic acid esters, 2,3,3',4, 4',5'-hexahydroxybenzophenone 1,2-naphthoquinonediazide-5-sulfonic acid esters, 1,2-quinonediazidesulfonic acid esters of of bis[(poly)-hydroxyphenyl]alkanes such as bis(p-hydroxyphenyl)-methane 1,2-naphthoquinonediazide-4-sulfonic acid esters, bis(2,4-dihydroxyphenyl)-methane 1,2-naphthoquinonediazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters, and 2,2-bis(2,3,4-tri-1,2-naphthoquinonediazide-5-sulfonic acid esters. U.S. Pat. No. 5,256,521 to Jayaraman discusses photoactive compounds at length, and the complete contents of that patent application is herein incorporated by reference.

In addition to the novolak, the photoactive compound, and the polyalkylmethacrylate co-polymer of polyhydroxystyrene, the photoresist can include a number of additives including colorants, dyes, striation aids, leveling agents, plasticizers, adhesion promoters, surfactants, speed enhancers, etc. Dyes help increase resolution by inhibiting back scattering of light off the substrate.

In producing the photoresist composition, the novolak, photoactive compound, and polalkylmethacrylate copolymer of polyhydroxystyrene are combined in the presence of solvents such as proplylene glycol mono-alkyl ether, propylene glycol alkyl ether acetate, butyl acetate, xylene, ethylene glycol mono-methyl ether acetate, propylene glycol mono-methyl ether acetate, ethyl lactate, ethyl-3-ethoxypropionate, and mixtures thereof. In a preferred embodiment, the solvent is selected from the group consisting of propylene glycol monomethylether acetate (PMA) ethyl-3-ethoxy-propionate (EEP), and ethyl lactate (EL). The solvent preferably constitutes between 50 and 90% w/w of the photoresist composition once formulated. Thus, the novolak, photoactive compound, and polalkylmethacrylate copolymer of poly(p-hydroxystyrene) will constitute between 40 and 10% w/w of the photoresist composition.

EXAMPLE

A photosensitivity study was done with a meta/para 50/50 cresol novolak, tris-hydroxyphenyl ethane diazoquinone sulfonyl ester, polyhydroxystyrene-polymethylmethacrylate (PHS-PMMA) of 50/50 copolymer ratio (the copolymer ratio can be varied considerably, e.g., 90/10 to 10/90) and of 9,000 molecular weight, and a casting solvent of propylene glycol methyl ether acetate (PMA). The resists were cast to 1.08 μm on bare silicon, exposed with a I line 365 nm stepper, and developed in 0.263N tetramethyl ammonium hydroxide developer. Table 1 shows the photospeed of various novolak compositions produced.

TABLE 1

| Diazoquinone by wt s/s | Novolak s/s | PHS-PMMA s/s | PMA % wt/wt | Photospeed mj |
|---|---|---|---|---|
| 17% | 83% |  | 77% | 125 |
| 17% | 76% | 7% | 77% | 116 |
| 17% | 71% | 12% | 77% | 108 |
| 17% | 63% | 20% | 77% | 102 |

Table 1 clearly shows that the addition of PHS-PMMA to the novolak increased the photospeed. In addition, the addition of PHS-PMMA to the novolak enhanced the thermal stability of the formulation, and there was no loss of unexposed resist or profile distortion. The preferred % wt/wt of the PHS-PMFLA, or other similar copolymer, ranges from 0.1–15% wt/wt.

While the invention has been described in terms of its preferred embodiments, those skilled in the art will recognize that the invention can be practiced with modification within the spirit and scope of the appended claims.

We claim:

1. A photoresist composition, comprising:

a novelok resin;

a polyalkylmethacrylate co-polymer of polyhydroxystyrene in admixture with said novelok resin, said polyalkylmethacrylate co-polymer of polyhydroxystyrene having the chemical formula:

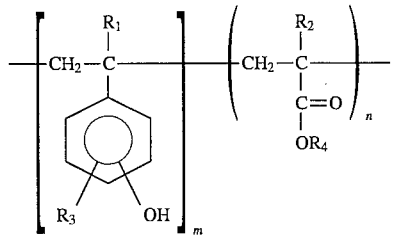

where $R_2$ is a methyl group, and $R_1$ and $R_3$ are each hydrogen or alkyl moieties and may be the same or different, where $R_4$ is an alkyl or aryl moiety, where m and n are each greater than one and may be the same or different, and wherein said polyhydroxystyrene is poly(p-hydroxystyrene); and a photoactive compound.

2. The photoresist composition of claim 1 wherein said photoactive compound is a diazonaphthoquinone.

3. The photoresist composition of claim 2 wherein said photoactive compound is selected from the group consisting of trishydroxyphenylesters of 4 or 5 diazoquinone sulfonic acid, and bisphenol-A esters of the same.

4. The photoresist composition of claim 1 wherein said novolak resin is formed from a material selected from the group consisting of meta/para cresol, meta/xylenols, and meta/trimethylphenols, and blends thereof.

5. The photoresist composition of claim 1 wherein said polyalkylmethacrylate co-polymer of polyhydroxystyrene is poly(p-hydroxystyrene)-co-(methylmethacrylate).

6. The photoresist composition of claim 5 wherein said poly(p-hydroxystyrene)-co-(methylmethacrylate) comprises 0.1 to 15% w/w of said photoresist composition.

7. A method of modifying or adjusting the photospeed of novolok based photoresists, comprising the steps of:

obtaining a novolok based photoresist containing a photoactive compound; and adding to said novolok based photoresist a sufficient amount of a polyalkylmethacrylate co-polymer of polyhydroxystyrene, said polyalkylmethacrylate co-polymer of polyhydroxystyrene having the chemical formula:

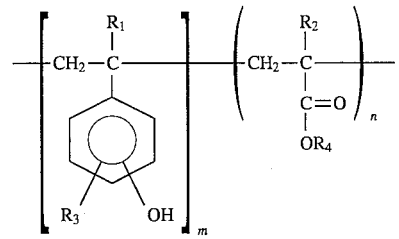

where $R_2$ is a methyl group, and $R_1$ and $R_3$ are each hydrogen or alkyl moieties and may be the same or different, where $R_4$ is an alkyl or aryl moiety, where m and n are each greater than one and may be the same or different, and wherein said polyhydroxystyrene is poly(p-hydroxystyrene), to adjust a photospeed of said novolak based photoresist.

8. A method of using a polyalkylmethacrylate co-polymer of polyhydroxystyrene to adjust performance characteristics of a novolok based photoresist, comprising the steps of adding to a novolok based photoresist including a photoactive compound a sufficient amount of a polyalkylmethacrylate co-polymer of polyhydroxystyrene, said polyalkylmethacrylate co-polymer of polyhydroxystyrene having the chemical formula:

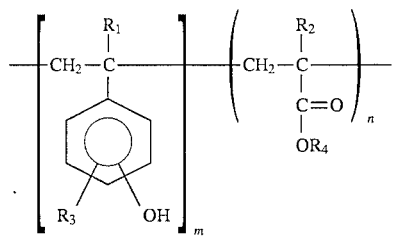

where $R_2$ is a methyl group, and $R_1$ and $R_3$ are each hydrogen or alkyl moieties and may be the same or different, where $R_4$ is an alkyl or aryl moiety, where m and n are each greater than one and may be the same or different, and wherein said polyhydroxystyrene is poly(p-hydroxystyrene), to adjust the performance of said novolok based photoresist.

9. The method of claim 7 wherein said polyalkyl-methacrylate co-polymer of polyhydroxystyrene is poly(p-hydroxystyrene)-co-methylmethacrylate).

10. The method of claim 8 wherein said polyalkylmethacrylate co-polymer of polyhydroxystyrene is poly(p-hydroxystyrene)-co-methylmethacrylate.

11. A photoresist composition, comprising:
   a novolok resin;
   a polyalkylmethacrylate co-polymer of polyhydroxystyrene in admixture with said novolok resin, said polyalkylmethacrylate co-polymer of polyhydroxystyrene having the chemical formula:

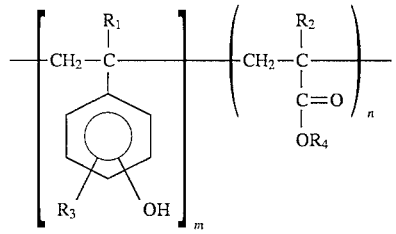

where $R_1$ is a hydrogen, $R_2$ is a methyl group, $R_3$ is a hydrogen or alkyl moiety, $R_4$ is an alkyl or aryl moiety, and where m and n are each greater than one and may be the same or different; and
   a photoactive compound.

12. The photoresist composition of claim 11 wherein said polyhydroxystyrene is poly(p-hydroxystyrene).

13. The photoresist composition of claim 11 wherein $R_4$ is a methyl group.

14. A method of modifying or adjusting the photospeed of novolok based photoresists, comprising the steps of:
   obtaining a novolok based photoresist containing a photoactive compound; and
   adding to said novolok based photoresist a sufficient amount of a polyalkylmethacrylate co-polymer of polyhydroxystyrene, said polyalkylmethacrylate co-polymer of polyhydroxystyrene having the chemical formula:

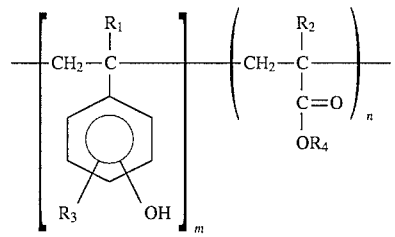

where $R_1$ is a hydrogen, $R_2$ is a methyl group, $R_3$ is a hydrogen or alkyl moiety, $R_4$ is an alkyl or aryl moiety, and where m and n are each greater than one and may be the same or different, to adjust a photospeed of said novolok based photoresist.

15. The method of claim 14 wherein said polyhydroxystyrene is poly(p-hydroxystyrene).

16. The method of claim 14 wherein $R_4$ is a methyl group.

17. A method of using a polyalkylmethacrylate co-polymer of polyhydroxystyrene to adjust performance characteristics of a novolok based photoresist, comprising the steps of adding to a novolok based photoresist including a photoactive compound a sufficient amount of a polyalkylmethacrylate co-polymer of polyhydroxystyrene, said polyalkylmethacrylate co-polymer of polyhydroxystyrene having the chemical formula:

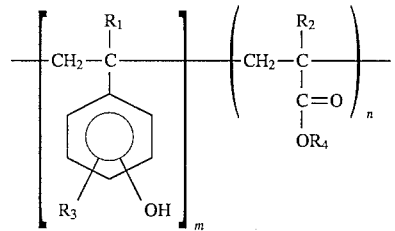

where $R_1$ is a hydrogen, $R_2$ is a methyl group, $R_3$ is a hydrogen or alkyl moiety, $R_4$ is an alkyl or aryl moiety, and where m and n are each greater than one and may be the same or different, to adjust the performance of said novolok based photoresist.

18. The method of claim 17 wherein said polyhydroxystyrene is poly(p-hydroxystyrene).

19. The method of claim 17 wherein $R_4$ is a methyl group.

* * * * *